US008405534B2

(12) United States Patent
Tanahashi et al.

(10) Patent No.: US 8,405,534 B2
(45) Date of Patent: Mar. 26, 2013

(54) TWO-WIRE TRANSMITTER

(75) Inventors: Tomoatsu Tanahashi, Tokyo (JP); Yoshiro Yamaha, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 77 days.

(21) Appl. No.: 13/131,945

(22) PCT Filed: Oct. 15, 2010

(86) PCT No.: PCT/JP2010/006136
§ 371 (c)(1), (2), (4) Date: May 31, 2011

(87) PCT Pub. No.: WO2011/048786
PCT Pub. Date: Apr. 28, 2011

(65) Prior Publication Data

US 2011/0234434 A1 Sep. 29, 2011

(30) Foreign Application Priority Data

Oct. 21, 2009 (JP) ................................ 2009-242722

(51) Int. Cl.
*H03M 1/00* (2006.01)

(52) U.S. Cl. ........................................ 341/110; 702/130

(58) Field of Classification Search ................... 341/110
See application file for complete search history.

(56) References Cited

U.S. PATENT DOCUMENTS 4,205,327 A * 5/1980 Dahlke .................... 340/870.39
4,206,397 A * 6/1980 Dahlke ......................... 323/273
5,345,166 A * 9/1994 Leonard et al. ............... 323/324
5,373,226 A 12/1994 Kimura
5,481,200 A * 1/1996 Voegele et al. ............... 324/718
6,437,581 B1 8/2002 Blossfeld
2002/0082799 A1* 6/2002 Pramanik ...................... 702/130
2002/0125949 A1 9/2002 Stenberg
2002/0153885 A1 10/2002 Blossfeld
2004/0130306 A1 7/2004 Sudou et al.

(Continued)

FOREIGN PATENT DOCUMENTS

CN 1487384 4/2004
CN 1700129 11/2005

(Continued)

OTHER PUBLICATIONS

Chinese Office Action dated Jul. 10, 2012 for corresponding application No. CN201080003441.7.

*Primary Examiner* — Khai M Nguyen
(74) *Attorney, Agent, or Firm* — Morgan, Lewis & Bockius LLP

(57) ABSTRACT

There is provided a two-wire transmitter capable of obtaining a signal reflecting a continuous change in a sensor signal, and in addition, facilitating a configuration or processing in a subsequent stage. The two-wire transmitter that outputs an analog voltage signal V3 based upon a sensor signal V1 to a transmission line N1 includes: an intermediate potential generation circuit (100) for generating an intermediate potential between the transmission line N1 and a transmission line N2; an operational amplifier (101) to which the sensor signal V1 and a feedback signal V2 are supplied; and a current source (102) for generating a current I3 flowing from the transmission line N1 to the transmission line N2, based upon a control signal output from the operational amplifier (101). In this situation, the control signal controls the operational amplifier (101) to equalize the sensor signal V1 and the feedback signal V2.

10 Claims, 3 Drawing Sheets

U.S. PATENT DOCUMENTS

2008/0309476 A1 12/2008 Averitt
2010/0054302 A1* 3/2010 Anzai .......................... 374/178

FOREIGN PATENT DOCUMENTS

JP S57-37279 Y2 8/1982
JP 3-51038 B2 8/1991
JP 7-036297 U 7/1995
JP 11-086177 3/1999
JP 2006-067166 3/2006
JP 2010-019781 1/2010

* cited by examiner

TWO-WIRE TRANSMITTER

TECHNICAL FIELD

The present invention relates to a two-wire transmitter, and more particularly, to a two-wire transmitter for outputting a sensor signal sensed by, for example, a sensor, as an analog signal.

BACKGROUND ART

A two-wire transmitter is a device, which senses a physical quantity such as a flow rate or a pressure and then outputs the sensed value (hereinafter, referred to as "sensor signal"). As a two-wire transmitter that converts a sensor signal to an analog voltage signal to be output, for example, there is known a two-wire transmitter described in Patent Document 1.

FIG. 5 is a diagram for discussing a conventional technique of the two-wire transmitter. Such an illustrated two-wire transmitter 10 is provided with: an operational amplifier 1 for amplifying sensor signals M1 and M2 output from a sensor S; a switch 3 capable of switching a connection target in accordance with the voltage value of a sensor signal $V_{sns}$ output from the operational amplifier 1; and resistance elements 5, 6, and 7 connected to the switch 3. The two-wire transmitter 10 is also provided with: a reference voltage generator 4; a resistance element 6 connected to the switch 3; and an operational amplifier 2 that changes an output current $I_{out}$ depending on the resistance magnitude of the resistance element 7.

The sensor S is a sensor for sensing the physical quantity such as a magnetic strength, temperature, pressure, or the like.

The two-wire transmitter 10 illustrated in FIG. 5 operates as will be described below.

The operational amplifier 1 outputs the sensor signal $V_{sns}$ that continuously changes. When the sensor signal $V_{sns}$ exceeds a prescribed threshold value, the connection target of the switch 3 is switched from the resistance element 6 to the resistance element 7. The potential difference between the output signal $V_{out}$ of the operational amplifier 2 and the ground (GND) is divided by the resistance element 5, and the resistance element 6 or the resistance element 7 connected to the switch 3. The signal in accordance with the divided potential is input into the operational amplifier 2, as a feedback signal $V_{fb}$. The operational amplifier 2 operates to equalize the reference voltage $V_{ref}$ generated by the reference voltage generator 4 and the voltage value of the feedback signal $V_{fb}$.

For this reason, when the voltage value of the feedback signal $V_{fb}$ increases, the operational amplifier 2 operates to increase the output current $I_{out}$. In this situation, the voltage value of the output signal $V_{out}$ decreases to equalize the reference voltage $V_{ref}$ and the voltage value of the feedback signal $V_{fb}$.

On the other hand, when the voltage value of the feedback signal $V_{fb}$ decreases, the operational amplifier 2 operates to decrease the output current $I_{out}$. As a result, the voltage value of the output signal $V_{out}$ from the operational amplifier 2 increases to equalize the reference voltage $V_{ref}$ and the voltage value of the feedback signal $V_{fb}$.

FIG. 6 is a diagram showing a relationship between the sensor signal and the output signal in the conventional two-wire transmission lines. In FIG. 6, the vertical axis represents the voltage value of the output signal $V_{out}$, and the horizontal axis represents a resistance R of the two-wire transmitter. The relationship between the resistance R and the voltage value of the output signal $V_{out}$ of the two-wire transmitter is expressed by the following equation (1). In the equation (1), R0 is a resistance value of the resistance element 5 shown, and R is any one of resistance values (R1 and R2) of the resistance element 6 and the resistance element 7, to be chosen by the switch 3.

$$V_{out}=V_{ref}+(R0/R)\cdot V_{ref} \quad (1)$$

The sensor signal $V_{sns}$ output from the sensor S continuously changes. Then, when the sensor signal $V_{sns}$ exceeds a prescribed threshold value, the connection target of the switch 3 is switched to the resistance element 7 from the resistance element 6.

Prior Art Documents

Patent Documents

Patent Document 1: U.S. Pat. No. 6,437,581 B1

SUMMARY OF THE INVENTION

Problem to be Solved by the Invention

It should be noted that, however, according to the above-described equation (1), the voltage value of the output signal $V_{out}$ discretely changes in spite that the sensor signal $V_{sns}$ continuously changes. Accordingly, the voltage value of the output signal $V_{out}$ is not proportional to the sensor signal $V_{sns}$ in the conventional two-wire transmitter, thereby making unavailable the voltage value of the output signal $V_{out}$ reflecting the sensor signal $V_{sns}$. Since FIG. 6 shows a case where plural resistance elements are provided including the resistance elements 6 and 7, the voltage values of plural discrete output signals $V_{out}$ are shown.

In order to deal with the above problem, in the conventional configuration, the output signal $V_{out}$ is input into the Central Processing Unit (CPU), not shown, in the subsequent stage so that the output signal $V_{out}$ needs to be subject to arithmetic processing on the CPU.

The present invention has been made in view of the above mentioned problems, and has an object to provide a two-wire transmitter capable of obtaining a signal reflecting a continuous change in a sensor signal by converting the sensor signal to a continuous analog signal, and in addition, simplifying a configuration or processing for calculation in a subsequent stage.

Solution to the Problem

In order to solve the above problem, according to an aspect of the present invention, there is provided a two-wire transmitter for outputting an analog voltage signal (an example is an output signal V3 illustrated in FIG. 1) based upon an input signal (an example is a sensor signal V1 illustrated in FIG. 1) to a first transmission line (an example is a transmission line N1 illustrated in FIG. 1), the two-wire transmitter comprising: an intermediate potential generation circuit (an example is resistance elements 103 and 104 illustrated in FIG. 1) for generating an intermediate potential between the first transmission line and a second transmission line (an example is a transmission line N2 illustrated in FIG. 1); an amplifier (an example is an operational amplifier 101 illustrated in FIG. 1) supplied with the input signal and the intermediate potential; and a current generation circuit (an example is a current source 102 illustrated in FIG. 1) for generating a current flowing from the first transmission line to the second transmission line base upon a control signal output from the amplifier.

In addition, in the two-wire transmitter according to the above-described invention, preferably, the first transmission line is connected to a power supply (an example is $V_{cc}$ illustrated in FIG. 3) through a first resistance element (an example is a resistance element 107 illustrated in FIG. 3).

Furthermore, in the two-wire transmitter according to the above-described invention, preferably, the amplifier outputs the control signal to equalize the input signal that has been input and the intermediate potential.

In addition, in the two-wire transmitter according to the above-described invention, preferably, the intermediate potential generation circuit includes a second resistance element (an example is a resistance element 103 illustrated in FIG. 1) and a third resistance element (an example is a resistance element 104 illustrated in FIG. 1) connected in series between the first transmission line and the second transmission line, and generates the intermediate potential between the second resistance element and the third resistance element.

Furthermore, in the two-wire transmitter according to the above-described invention, preferably, the current generation circuit includes a current source for generating the current based upon the intermediate potential.

In addition, in the two-wire transmitter according to the above-described invention, preferably, the analog voltage signal is supplied to the amplifier as electric power via the first transmission line.

Furthermore, preferably, the two-wire transmitter according to the above-described invention further comprises a receiver (an example is a CPU receiver 106 illustrated in FIG. 3) connected to the first transmission line and for receiving the analog voltage signal.

In addition, preferably, the two-wire transmitter according to the above-described invention further comprises: a process circuit (an example is an A/D conversion circuit 401, a digital arithmetic unit 402 illustrated in FIG. 4) for converting the input signal, when the input signal is an analog signal, into a digital signal, and processing the digital signal; and a digital-analog conversion circuit (an example is a D/A conversion circuit 403 illustrated in FIG. 4) for converting the digital signal processed by the process circuit into an analog signal to be output to the amplifier.

Furthermore, in the two-wire transmitter according to the above-described invention, preferably, the input signal is a sensor signal output from a sensor (an example is a sensor S illustrated in FIG. 1).

In addition, preferably, the two-wire transmitter according to the above-described invention further comprises a sensor for outputting the sensor signal.

Furthermore, preferably, the two-wire transmitter according to the above-described invention further comprises the first resistance element connected to the first transmission line, and the power supply connected to the first resistance element.

Advantageous Effects of the Invention

According to one aspect of the invention, the intermediate potential between the transmission line and the reference transmission line, and the input signal are output to the amplifier, so that the analog voltage signal can be generated based upon these signals. The amplifier operates to equalize the input signal that has been input and the intermediate potential. Accordingly, since the output from the amplifier changes depending on the input signal, it is made possible to obtain the analog voltage signal reflecting the input signal. In addition, from this signal, information on the temperature, magnetic strength, pressure, or the like can be extracted with ease. It is therefore possible to provide the two-wire transmitter capable of obtaining the signal reflecting, for example, a continuous change of the sensor signal.

According to another aspect of the invention, the external power supply is connected to the transmission line through the first resistance element, thereby properly maintaining the potential of the transmission line to which the analog voltage signal is output. In addition, the transmission line can be prevented from being short-circuited with an external power supply.

According to another aspect of the invention, the intermediate potential between the transmission line and the reference transmission line, and the input signal are output to the amplifier, and the analog voltage signal can be generated based upon this signal. The amplifier operates to equalize the input signal that has been input and the intermediate potential. Accordingly, since the output from the amplifier changes depending on the input signal, the analog signal reflecting the input signal is obtainable.

According to another aspect of the invention, the intermediate potential generation circuit includes the second resistance element and the third resistance element connected in series between the transmission line and the reference transmission line. Since the intermediate potential is output from between the second resistance element and the third resistance element, the voltage range of the output signal output from the amplifier is not limited by the reference voltage or the like.

According to another aspect of the invention, the current generation circuit includes the current source for generating the current based upon the intermediate potential. It is therefore possible to control the potential between the transmission line and the reference transmission line with ease.

According to another aspect of the invention, the analog voltage signal is supplied to the amplifier via the transmission line. Accordingly, the amplifier has two input systems, making the circuit configuration simplified.

According to another aspect of the invention the invention, the receiver connected to the transmission line is additionally provided, thereby directly obtaining the sensed value sensed by, for example, the sensor from the analog signal output to the transmission line. Accordingly, this simplifies calculation of the input signal, for example, the sensor signal in the receiver or in its subsequent stage.

According to another aspect of the invention, when the input signal is an analog signal, the input signal is converted into the digital signal to be subject to processing, and the processed digital signal is converted into an analog signal to be output to the amplifier. It is therefore possible to perform the offset or the correction of sensitivity of, for example, the sensor signal with ease and obtain the analog signal with an arbitrary characteristic.

According to another aspect of the invention, it is possible to extract the information on the temperature, magnetic strength, pressure, or the like sensed by the sensor with ease.

According to another aspect of the invention, the two-wire transmission compact in size and including the sensor is achieved.

According to another aspect of the invention, the two-wire transmission compact in size and including the power supply connected to the resistance element and the resistance element is achieved.

BRIEF DESCRIPTION OF THE INVENTION

DESCRIPTION OF EMBODIMENTS

Hereinafter, an embodiment 1, an embodiment 2, and an embodiment 3 will be described with reference to the drawings.

(Embodiment 1)

Circuit Configuration

Figure 1:
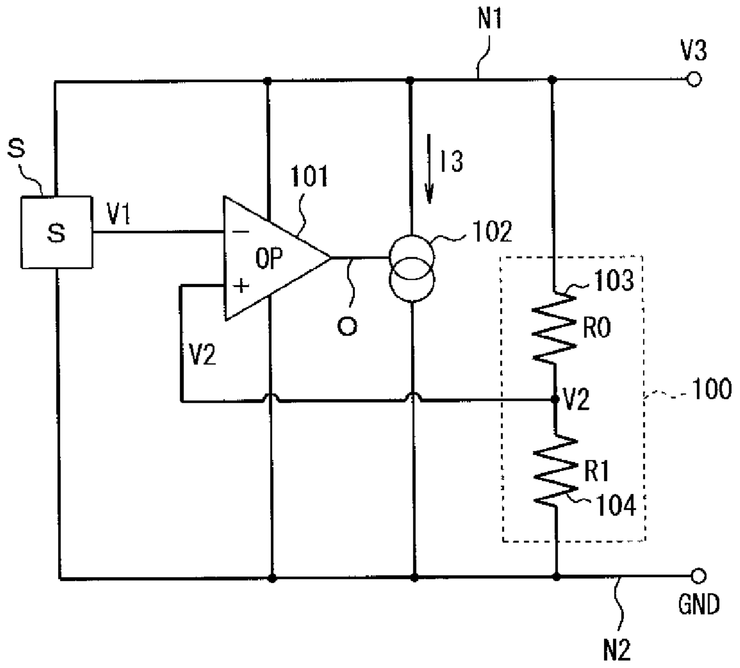
FIG. 1 is a circuit diagram illustrative of a two-wire transmitter according to an embodiment 1 of the present invention.

FIG. 1 is a circuit diagram illustrative of a two-wire transmitter according to an embodiment 1 of the present invention. The illustrated two-wire transmitter is provided with a sensor S. The sensor S is a sensor for sensing the physical quantity such as, for example, a magnetic strength, temperature, pressure, or the like, and then outputting the sensed value as a sensor signal V1. Herein, the two-wire transmitter is provided with the sensor S. However, the sensor S may be externally arranged separately from the two-wire transmitter instead of internally including the sensor S in the two-wire transmitter.

The two-wire transmitter converts an input signal (an example is a sensor signal V1) into an analog voltage signal and then outputs the converted signals to transmission lines. The two-wire transmitter includes: an intermediate potential generation circuit 100 for generating an intermediate potential between a transmission line N1 and a reference transmission line N2; an operational amplifier 101 to which the sensor signal V1 and the intermediate potential are supplied; and a current source 102 for generating an output signal V3 that is an analog voltage signal. In such a configuration, since the intermediate potential is fed back to the operational amplifier 101, hereinafter, the intermediate potential will be referred to as feedback signal V2 in the present embodiment.

The operational amplifier 101 generates a signal o for controlling the potential between the transmission line N1 and the reference transmission line N2 so that the input sensor signal V1 and the feedback signal V2 are equalized to each other. The current source 102 changes an output current I3 depending on the control signal o of the operational amplifier 101.

Additionally, the intermediate potential generation circuit 100 includes a resistance element 103 and a resistance element 104 connected in series between the transmission line N1 and the reference transmission line N2, and outputs the feedback signal V2 from between the resistance element 103 and the resistance element 104.

A signal line of the sensor signal V1 output from the sensor S is connected to an inverting input terminal of the operational amplifier 101. In addition, a signal line of the feedback signal V2 is connected to a non-inverting input terminal of the operational amplifier 101. The output terminal of the operational amplifier 101 is connected to the current source 102. The above configuration and the intermediate potential generation circuit 100 are connected between the transmission line N1 serving as a power supply line and the reference transmission line N2. The power applied to the output signal V3 is supplied from the transmission line N1 and the power applied to the GND potential is supplied from the reference transmission line N2.

Specifically, in the two-wire transmitter according to the embodiment 1, an external power supply is connected to the transmission line N1 through a resistance element, not illustrated, so that the output signal V3 should be pulled up, whereas the reference transmission line N2 is set to the GND.

Operation

Next, an operation of the above-described two-wire transmitter will be described.

The potential difference between the output signal V3 and the GND is divided by the resistance element 103 and the resistance element 104. The feedback signal V2 is a signal representing the voltage divided by the resistance element 103 and the resistance element 104. The operational amplifier 101 operates to equalize the sensor signal V1 and the feedback signal V2.

To be more specific, the operational amplifier 101 controls the current supply 102 to reduce the output current I3 and increase the output voltage V3, when the sensor signal V1 increases. By this operation, currents flowing through the resistance element 103 and the resistance element 104 are increased and the feedback signal V2 increases. The reduced amount of the output current I3 corresponds to the increased amount of the sensor signal V1. Therefore, the feedback signal V2 increases in response to the increase of the sensor signal V1, so that the sensor signal V1 and the feedback signal V2 are made equal to each other. That is to say, the output signal V3 of the operational amplifier 101 increases to equalize the sensor signal V1 and the feedback signal V2.

On the other hand, when the sensor signal V1 decreases, the operational amplifier 101 controls the current source 102 to increase the output current I3 and decrease the output voltage V3. By this operation, the currents flowing across the resistance elements 103 and 104 are decreased and then the feedback signal V2 is decreased. The increased amount of the output current I3 corresponds to the decreased amount of the sensor signal V1. Accordingly, the feedback signal V2 decreases in response to the decrease of the sensor signal V1, so the sensor signal Vi and the feedback signal V2 are equalized to each other. That is to say, the output signal V3 decreases to equalize the sensor signal V1 and the feedback signal V2.

The relationship between the sensor signal V1 and the output signal V3 is expressed by the following equation (2). Specifically, in the equation (2), R0 is a resistance value of the resistance element 103 and R1 is a resistance value of the resistance element 104.

$$V3=(1+(R0/R1))\cdot V1 \tag{2}$$

In the above equation (2), in the two-wire transmitter according to the present embodiment, it is apparent that the sensor signal V1 is converted into a continuous analog voltage signal.

Figure 2:
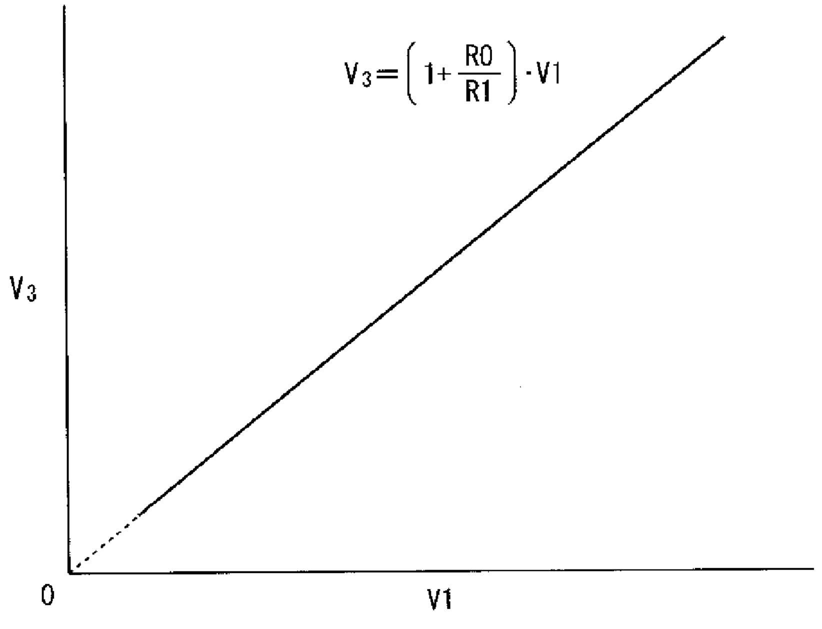
FIG. 2 is a diagram illustrative of a relationship between an output signal and a sensor signal according to the embodiment 1 of the present invention.

FIG. 2 is a diagram illustrative of the relationship between the output signal V3 and the sensor signal V1, which is expressed by the equation (2), where the vertical axis represents the output signal V3, and the horizontal axis represents the sensor signal V1. FIG. 2 exhibits that the sensor signal V1 is converted into a continuous analog voltage signal, that is, the output signal V3 is proportional to the sensor signal V1.

According to the embodiment 1 as described above, the feedback signal V2 serving as the intermediate potential between the transmission line N1 and the reference transmission line N2, and the sensor signal V1 are output to the operational amplifier 101, thereby enabling to the analog voltage signal to be generated based upon the output signals. The operational amplifier 101 controls the potential between the transmission line N1 and the reference transmission line N2 so that the sensor signal V1 that has been input and the feedback signal V2 are equalized to each other. Therefore, the potential between the transmission line N1 and the reference transmission line N2 changes depending on the sensor signal V1. Accordingly, since the output from the operational amplifier 101 changes depending on the sensor signal V1, the analog signal reflecting the sensor signal V1 is made available. Moreover, from this signal, it is possible to extract information with ease such as a temperature, magnetic strength, pressure, or the like that has been sensed by the sensor S.

(Embodiment 2)

Figure 3:
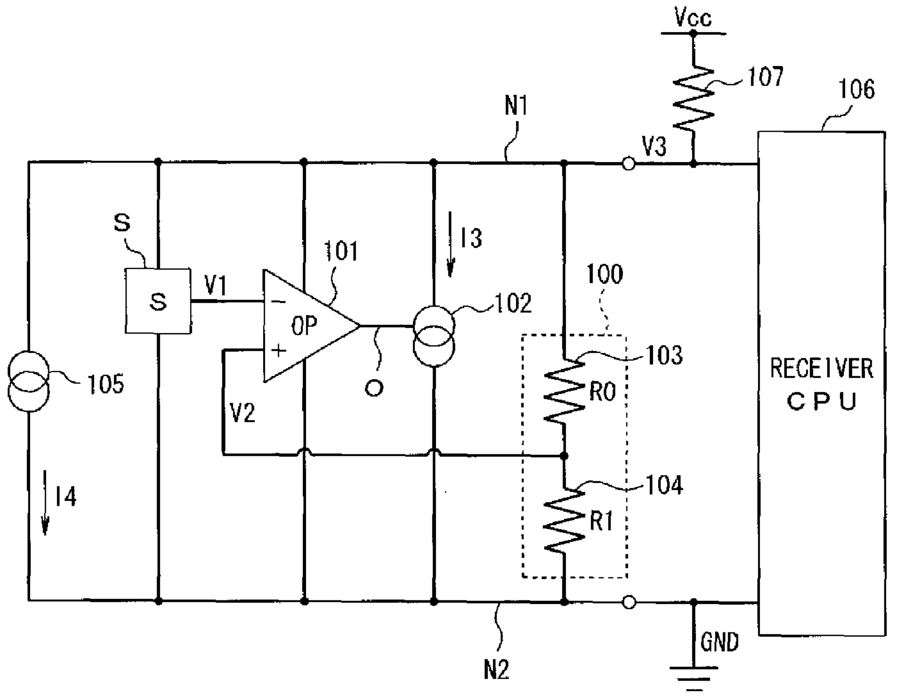
FIG. 3 is a circuit diagram illustrative of a two-wire transmitter according to an embodiment 2 of the present invention.

FIG. 3 is a circuit diagram illustrative of a two-wire transmitter according to an embodiment 2 of the present invention. In the embodiment 2, in the components and configurations illustrated in FIG. 3, the same components and configurations as those illustrated in FIG. 1 have the same reference numerals and a detailed explanation will be partially omitted.

Configuration

The two-wire transmitter according to the embodiment 2 is configured such that a receiver CPU 106 is connected to the two-wire transmitter according to the embodiment 1 illustrated in FIG. 1. In addition, in FIG. 3, an external power supply $V_{cc}$ and a resistance element 107 connected to the transmission line N1 and the GND line connected to the reference transmission line N2 are explicitly illustrated to represent the state where the two-wire transmitter is used. The two-wire transmitter is supplied with the power applied to the output signal V3 through the resistance element 107 and the transmission line N1, from the external power supply $V_{cc}$.

Herein, the two-wire transmitter may be provided with the external power supply $V_{cc}$ or the resistance element 107, or the external power supply $V_{cc}$ or the resistance element 107 may be externally arranged separately from the two-wire transmitter instead of being included in the two-wire transmitter.

The receiver CPU 106 is fed with the output signal V3 of the two-wire transmitter, and senses the magnitude or strength of the physical quantity sensed by the sensor S. In the circuit of FIG. 3, a current supply 105 denotes all current supplies except for the current supply 102 and 14 denotes the total amount of all the currents except for the output current I3, in the two-wire transmitter.

Operation

Next, an operation of the two-wire transmitter according to the embodiment 2 will be described.

The output signal V3 of the two-wire transmitter according to the embodiment 2 is pulled up to the external power supply $V_{cc}$ through the resistance element 107. When the sensor signal V1 decreases and the output current I3 increases, the voltage drop is increased in the resistance element 107 and the voltage of the output signal V3 decreases, in the embodiment 2. For this reason, in the embodiment 2, the output signals V3 that continuously decreases in response to the decrease of the sensor signal V1 is obtainable.

On the other hand, when the sensor signal V1 increases and the output current I3 decreases, the voltage drop in the resistance element 107 is decreased and the voltage of the output signal V3 is increased. Therefore, in the embodiment 2, obtainable is the output signal V3 that continuously increases in response to the increase of the sensor signal V1.

Accordingly, the two-wire transmitter according to the embodiment 2 is capable of converting the sensor signals V1 into the analog voltage signals V3 that are continuous in proportion to the sensor signals V1.

Moreover, the receiver CPU 106 receives the output signal V3 from the two-wire transmitter to acquire the information on the temperature, magnetic strength, pressure or the like sensed by the sensor S.

Figure 5:
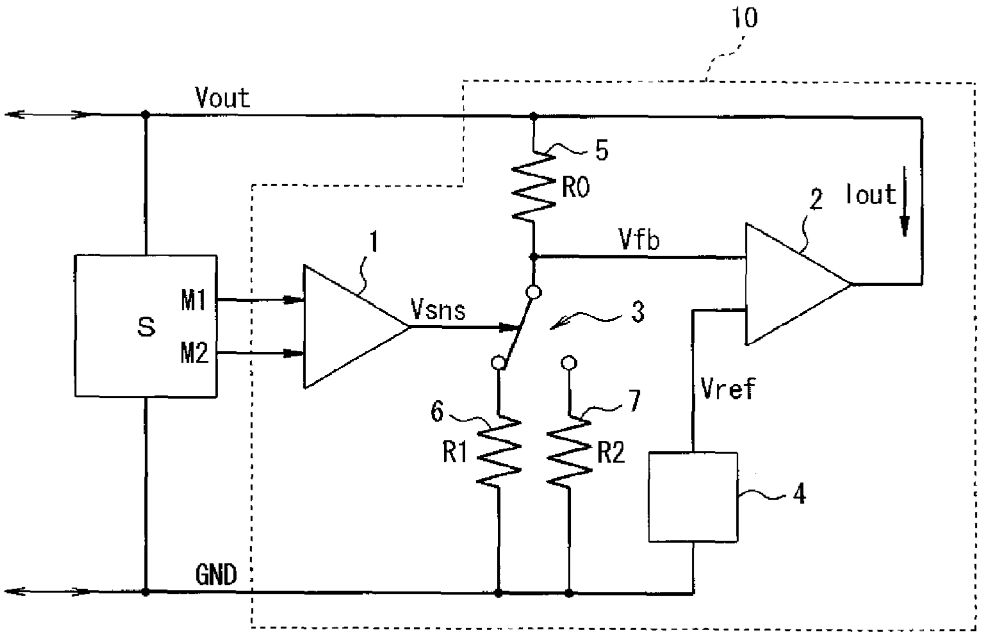
FIG. 5 is a diagram discussing a conventional technique of a two-wire transmitter.
Figure 6:
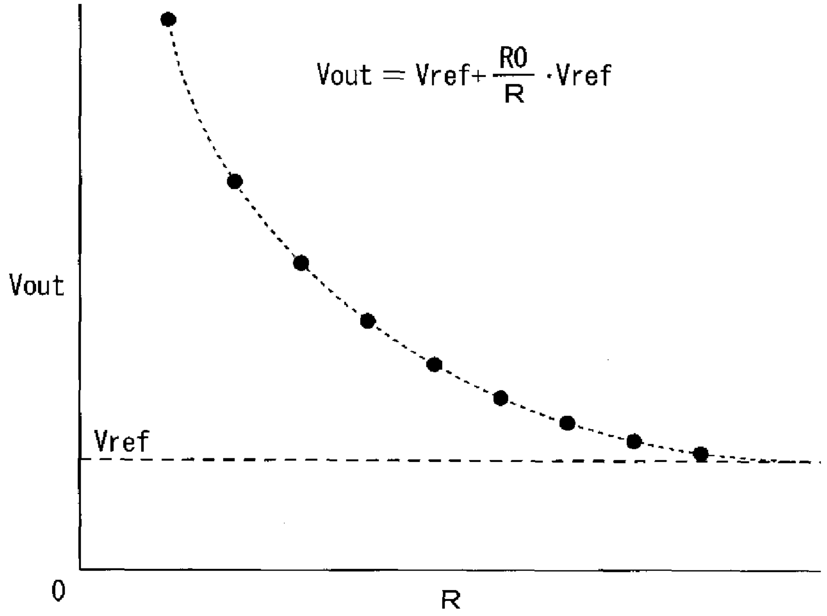
FIG. 6 is a diagram showing a relationship between a sensor signal and an output signal in conventional two-wire transmission lines.

In comparison with the embodiments 1 and 2 described heretofore, the conventional technique shown in FIG. 5 has the output signal $V_{out}$ that is discrete and is not proportional to the sensor signal $V_{sns}$. Complicated arithmetic processing therefore needs to be performed in order to extract by the receiver CPU the information on the temperature, magnetic strength, pressure or the like, from the output signal $V_{out}$. In contrast, in the two-wire transmitter according to the embodiment 2, the output signal V3 is an analog signal proportional to the sensor signal V1, thereby allowing the receiver CPU to extract the information included in the sensor signal with simple arithmetic calculation.

In addition, the voltage of the output signal $V_{out}$ cannot be set equal to or lower than the reference voltage $V_{ref}$ in the conventional technique, whereas there is no such a restriction in the two-wire transmitter according to the embodiment 2. In the embodiment 2, the arbitrary voltage of the output signal V3 is made available, by changing the values of the resistance elements 103 and 104.

(Embodiment 3)

Figure 4:
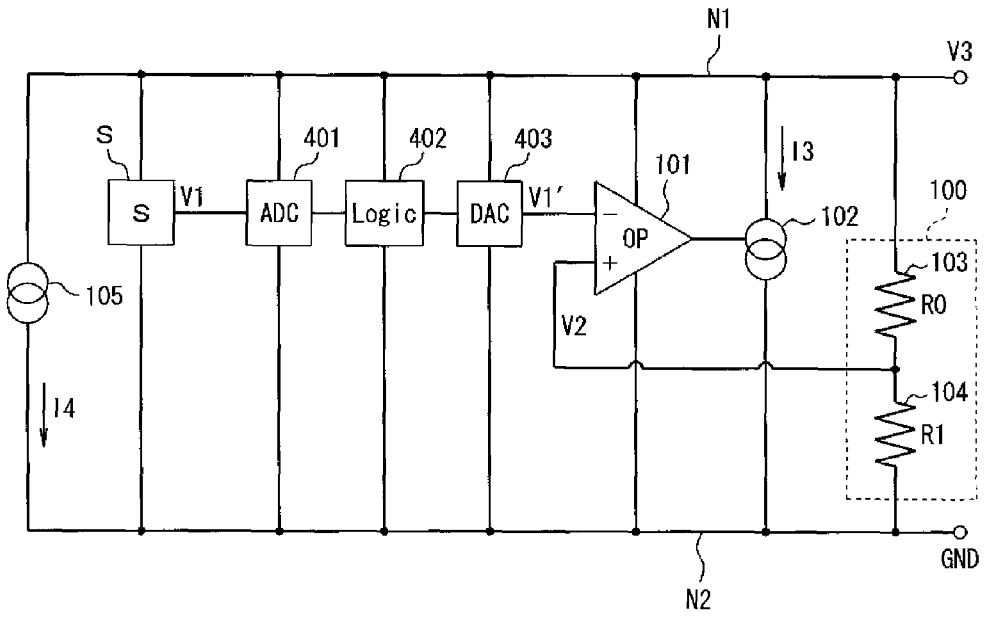
FIG. 4 is a circuit diagram illustrative of a two-wire transmitter according to an embodiment 3 of the present invention.

FIG. 4 is a circuit diagram illustrative of a two-wire transmitter according to an embodiment 3 of the present invention. In the embodiment 3, in the components and configurations illustrated in FIG. 4, the same components and configurations as those illustrated in FIG. 1 have the same reference numerals and a detailed explanation will be partially omitted.

Configuration

The two-wire transmitter according to the embodiment 3 is configured such that an A/D converter 401, a digital arithmetic unit 402, and a D/A converter 403 are added to the two-wire transmitter according to the embodiment 1 illustrated in FIG. 1. Also in FIG. 4 according to the embodiment 3, the current source 105 denotes all current sources except for the current source 102, and I4 denotes the total amount of all the currents except for the output current I3, in the two-wire transmitter.

Operation

The sensor signal V1 is converted into a digital signal by the A/D converter 401. The converted digital signal is subject to arithmetic processing of the digital arithmetic unit 402, and is then converted into an analog signal V1' by the D/A converter 403. According to the above embodiment 3, after the sensor signal V1 is converted into the analog signal V1' having an arbitrary characteristic, the same processing as that of the embodiment 1 can be performed.

In the embodiment 3, for example, advantageous is a case where after the offset or correction of the sensitivity of the sensor signal, the sensor signal is converted into the output signal V3.

INDUSTRIAL AVAILABILITY

The present invention described heretofore is applicable to any two-wire transmitter as far as it desirably reflects the sensed value sensed by the sensor to make the signals continuously changing available.

REFERENCE SIGNS LIST

100 intermediate potential generation circuit
101 operational amplifier
102, 105 current source
103, 104, 107 resistance element
106 CPU receiver
401 A/D converter
402 digital arithmetic unit
403 D/A converter

The invention claimed is:

1. A two-wire transmitter for outputting an analog voltage signal based upon an input signal to a first transmission line, the two-wire transmitter comprising:

an intermediate potential generation circuit configured to generate an intermediate potential between the first transmission line and a second transmission line;

an amplifier configured to be supplied with the input signal and the intermediate potential; and a current generation circuit configured to generate a current flowing from the first transmission line to the second transmission line base upon a control signal output from the amplifier, wherein the first transmission line is connected to an external power supply through a first resistance element.

2. The two-wire transmitter according to claim 1, wherein the amplifier is further configured to output the control signal to equalize the input signal that has been input and the intermediate potential.

3. The two-wire transmitter according to claim 1, wherein the intermediate potential generation circuit includes a second resistance element and a third resistance element connected in series between the first transmission line and the second transmission line, and is further configured to generate the intermediate potential between the second resistance element and the third resistance element.

4. The two-wire transmitter according to claim 1, wherein the current generation circuit includes a current source configured to generate the current based upon the intermediate potential.

5. The two-wire transmitter according to claim 1, wherein the analog voltage signal is supplied to the amplifier via the first transmission line.

6. The two-wire transmitter according to claim 1, further comprising a receiver connected to the first transmission line and configured to receive the analog voltage signal.

7. The two-wire transmitter according to claim 1, further comprising:

a process circuit configured to:

convert the input signal, when the input signal is an analog signal, into a digital signal; and process the digital signal; and a digital-analog conversion circuit configured to convert the digital signal processed by the process circuit into an analog signal to be output to the amplifier.

8. The two-wire transmitter according to claim 1, wherein the input signal comprises a sensor signal output from a sensor.

9. The two-wire transmitter according to claim 1, further comprising a sensor configured to output the sensor signal.

10. The two-wire transmitter according to claim 1, further comprising:

the first resistance element connected to the first transmission line; and a power supply connected to the first resistance element.

* * * * *